(12) United States Patent
Murphy et al.

(10) Patent No.: US 9,593,434 B2
(45) Date of Patent: Mar. 14, 2017

(54) ALKYL PUSH FLOW FOR VERTICAL FLOW ROTATING DISK REACTORS

(71) Applicant: Veeco Instruments Inc., Plainview, NY (US)

(72) Inventors: Michael Murphy, Somerset, NJ (US); Richard Hoffman, Clinton, NJ (US); Jonathan Cruel, Plano, TX (US); Lev Kadinski, Burghausen (DE); Jeffrey C. Ramer, Sunnyvale, CA (US); Eric A. Armour, Pennington, NJ (US)

(73) Assignee: Veeco Instruments Inc., Plainview, NY (US)

( * ) Notice: Subject to any disclaimer, the term of this patent is extended or adjusted under 35 U.S.C. 154(b) by 208 days.

(21) Appl. No.: 14/255,016

(22) Filed: Apr. 17, 2014

(65) Prior Publication Data

US 2014/0224178 A1 Aug. 14, 2014

Related U.S. Application Data

(62) Division of application No. 10/568,794, filed as application No. PCT/US03/26112 on Aug. 20, 2003, now abandoned.

(51) Int. Cl.
*C30B 25/14* (2006.01)
*C23C 16/455* (2006.01)
(Continued)

(52) U.S. Cl.
CPC ............ *C30B 25/14* (2013.01); *C23C 16/455* (2013.01); *C23C 16/458* (2013.01);
(Continued)

(58) Field of Classification Search
None
See application file for complete search history.

(56) References Cited

U.S. PATENT DOCUMENTS

| 4,010,045 A | 3/1977 | Ruehrwein |
| 4,369,031 A | 1/1983 | Goldman et al. |

(Continued)

FOREIGN PATENT DOCUMENTS

| EP | 0339845 B1 | 1/1993 |
| JP | 1-047017 A | 2/1989 |

(Continued)

OTHER PUBLICATIONS

Korean Office Action for Application No. 10-2014-7010398 dated Jul. 9, 2014.

(Continued)

*Primary Examiner* — Joel Horning
(74) *Attorney, Agent, or Firm* — Lerner, David, Littenberg, Krumholz & Mentlik, LLP

(57) ABSTRACT

In a rotating disk reactor (1) for growing epitaxial layers on substrate (3), gas directed toward the substrates at different radial distances from the axis of rotation of the disk has substantially the same velocity. The gas directed toward portions of the disk remote from the axis (10a) may include a higher concentration of a reactant gas (4) than the gas directed toward portions of the disk close to the axis (10d), so that portions of the substrate surfaces at different distances from the axis (14) receive substantially the same amount of reactant gas (4) per unit area. A desirable flow pattern is achieved within the reactor while permitting uniform deposition and growth of epitaxial layers on the substrate.

7 Claims, 5 Drawing Sheets

(51) Int. Cl.
  *C23C 16/458* (2006.01)
  *C30B 25/16* (2006.01)
  *C30B 25/08* (2006.01)
  *C30B 25/12* (2006.01)
  *C23C 16/52* (2006.01)

(52) U.S. Cl.
  CPC .... *C23C 16/4584* (2013.01); *C23C 16/45563* (2013.01); *C23C 16/45565* (2013.01); *C23C 16/45574* (2013.01); *C23C 16/45578* (2013.01); *C23C 16/52* (2013.01); *C30B 25/08* (2013.01); *C30B 25/12* (2013.01); *C30B 25/165* (2013.01)

(56) References Cited

U.S. PATENT DOCUMENTS

| | | | |
|---|---|---|---|
| 4,579,609 A | | 4/1986 | Reif et al. |
| 4,741,354 A | | 5/1988 | DeMild, Jr. |
| 4,980,204 A | | 12/1990 | Fujii et al. |
| 4,993,358 A | | 2/1991 | Mahawili |
| 5,091,320 A | | 2/1992 | Aspnes et al. |
| 5,106,453 A | * | 4/1992 | Benko ............... C23C 16/455 117/104 |
| 5,269,847 A | | 12/1993 | Anderson |
| 5,393,232 A | | 2/1995 | Haines |
| 5,431,738 A | | 7/1995 | Murakami et al. |
| 5,487,358 A | | 1/1996 | Ohta et al. |
| 5,709,745 A | | 1/1998 | Larkin et al. |
| 5,843,234 A | | 12/1998 | Finn et al. |
| 5,853,484 A | | 12/1998 | Jeong |
| 5,956,148 A | | 9/1999 | Celii |
| 5,976,261 A | | 11/1999 | Moslehi et al. |
| 6,090,458 A | | 7/2000 | Murakami |
| 6,197,121 B1 | | 3/2001 | Gurary et al. |
| 6,280,581 B1 | | 8/2001 | Cheng |
| 6,289,842 B1 | | 9/2001 | Tompa |
| 6,333,272 B1 | | 12/2001 | McMillin et al. |
| 6,428,850 B1 | | 8/2002 | Shinriki et al. |
| 6,448,536 B2 | | 9/2002 | Li et al. |
| 6,480,286 B1 | | 11/2002 | Kubo et al. |
| 6,499,425 B1 | | 12/2002 | Sandhu et al. |
| 6,511,539 B1 | | 1/2003 | Raaijmakers |
| 6,534,332 B2 | | 3/2003 | Bourret-Courchesne |
| 6,887,523 B2 | | 5/2005 | Zhuang et al. |
| 7,524,532 B2 | | 4/2009 | Jurgensen et al. |
| 2002/0009868 A1 | | 1/2002 | Tobashi et al. |
| 2002/0076490 A1 | | 6/2002 | Chiang et al. |
| 2002/0185068 A1 | | 12/2002 | Gurary et al. |
| 2003/0056728 A1 | | 3/2003 | Lindner et al. |
| 2003/0091740 A1 | | 5/2003 | Gilbert et al. |
| 2003/0207032 A1 | | 11/2003 | Ahn et al. |
| 2006/0021574 A1 | | 2/2006 | Armour et al. |
| 2006/0121193 A1 | | 6/2006 | Strauch et al. |
| 2007/0134419 A1 | | 6/2007 | Mitrovic et al. |
| 2009/0017190 A1 | | 1/2009 | Sferlazzo et al. |
| 2009/0064932 A1 | | 3/2009 | Kim et al. |
| 2009/0236447 A1 | | 9/2009 | Panagopoulos et al. |
| 2010/0012034 A1 | | 1/2010 | Strauch et al. |
| 2012/0156363 A1 | | 6/2012 | Quinn et al. |

FOREIGN PATENT DOCUMENTS

| | | |
|---|---|---|
| JP | 01-140712 A | 6/1989 |
| JP | 2-096324 A | 4/1990 |
| JP | H02187018 A | 7/1990 |
| JP | H03262116 A | 11/1991 |
| JP | 4-364024 A | 12/1992 |
| JP | 05-335239 | 12/1993 |
| JP | 2000-091320 A | 3/2000 |
| JP | 2000286251 A | 10/2000 |
| JP | 2001-351864 A | 12/2001 |
| JP | 2002-155366 A | 5/2002 |
| KR | 10-0158780 | 11/1998 |
| KR | 2000-0069146 | 11/2000 |
| KR | 2002-0084102 | 11/2002 |
| KR | 10-2006-0079187 | 7/2006 |
| WO | 9823788 | 6/1998 |
| WO | 2005019496 | 3/2005 |
| WO | 2006020424 A2 | 2/2006 |

OTHER PUBLICATIONS

Brieland et al., "Design and Verification of Nearly Ideal Flow and Heat Transfer in a Rotating Disk Chemical Vapor Deposition Reactor," J. Electrochem. Soc., vol. 138, No. 5, Jun. 1991, pp. 1806-1816.
Japanese Office Action for Application No. 2010-153158 dated Apr. 19, 2013.
Korean Office Action for Application No. 10-2009-7009061 dated Dec. 23, 2013.
Korean Office Action for Application No. 10-2009-7009061 dated May 1, 2013.
Non-Final Office Action issued May 6, 2014 in connection with U.S. Appl. No. 12/972,270, filed Dec. 17, 2010, 13 pgs.
Office Action from corresponding Japanese Application 2005-508277, Jun. 19, 2009.
Office Action from U.S. Appl. No. 11/544,075 dated Mar. 24, 2010.

* cited by examiner

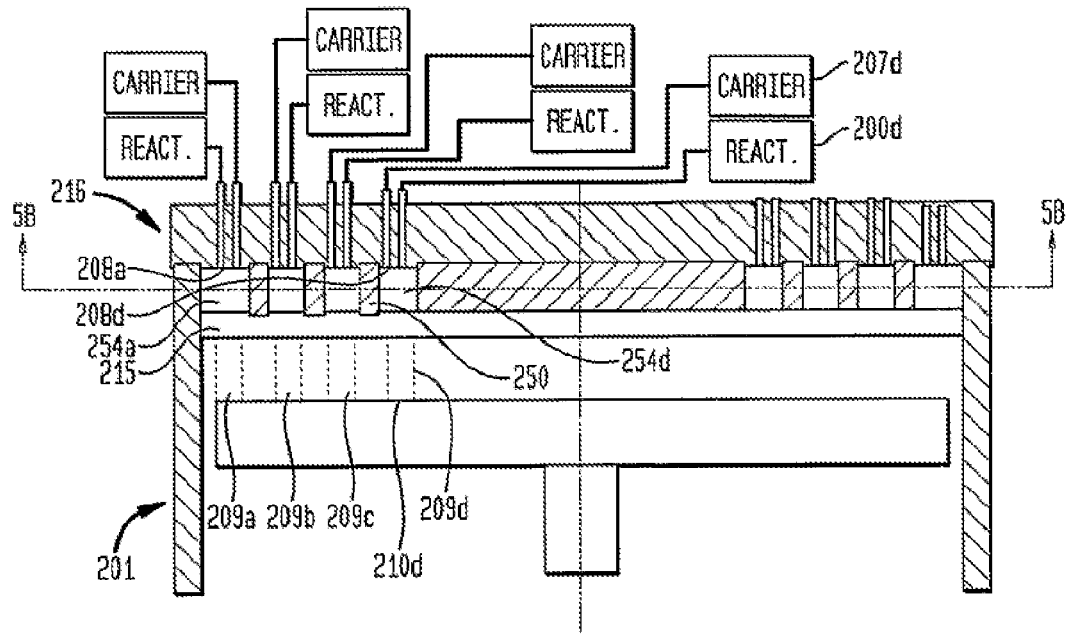
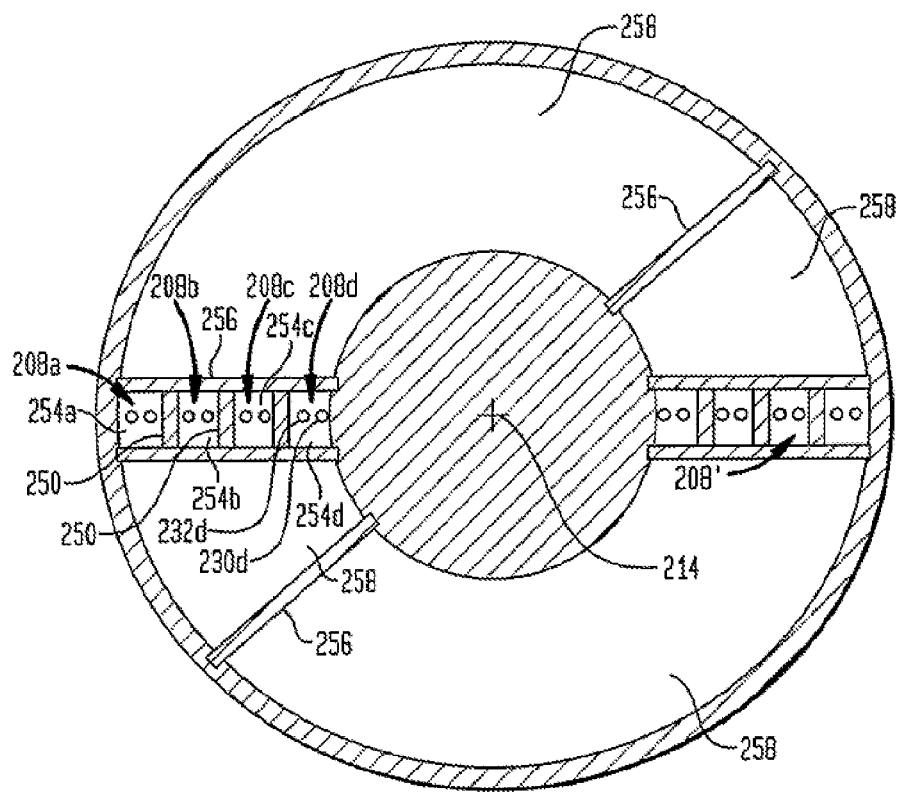

ALKYL PUSH FLOW FOR VERTICAL FLOW ROTATING DISK REACTORS

CROSS-REFERENCED TO RELATED APPLICATIONS

The present application is a divisional of U.S. application Ser. No. 10/568,794, filed on Nov. 8, 2006, which application is a national phase entry under 35 U.S.C. §371 of International Application No. PCT/US2003/026112 filed Aug. 20, 2003, all of which are hereby incorporated herein by reference.

TECHNICAL FIELD OF THE INVENTION

The present invention relates to metal organic chemical vapor phase deposition reactors. More particularly, the present invention relates to rotating disk reactors in which one or more gases are injected onto the surface of a rotating substrate to grow epitaxial layers thereon.

BACKGROUND OF THE INVENTION

Vertical high-speed rotating disk reactors, in which the gas or gases are injected downwardly onto a substrate surface rotating within a reactor, are frequently employed for metal organic chemical vapor deposition (MOCVD). Vertical disk-type CVD reactors, in particular, have been found useful for wide varieties of epitaxial compounds, including various combinations of semiconductor single films and multilayered structures such as lasers and LED'S. In these reactors, one or more injectors spaced above a substrate carrier provide a predetermined gas flow, which upon contact with the substrate, deposits layers of epitaxial material on the surface of the substrate.

For larger wafers, rotating disk reactors employ several injectors spaced above the substrate. The injectors are typically spaced above the wafer in various positions along one or more radial axes of the wafer, relative to the central axis of the substrate carrier. Frequently, the rate of source reactant material injected into the reactor varies from injector to injector to permit the same molar quantity of reactant to reach the surface of the substrate. Hence, some reactant injectors may have different gas velocities than others. This variation in reactant velocity is, in pertinent part, due to the relative placement of the injectors. As the reactor carrier holding the substrate rotates at a predetermined rate, the injectors near the outer edge of the carrier cover a larger region of surface area on the carrier than the injectors closer to the center of the carrier in any given time period. Thus, the outer injectors typically employ a greater gas velocity of reactant than the inner injectors in order to maintain desired uniformity. For example, individual injector gas velocities may differ by a factor of as much as three to four between adjacent injectors.

While this variation in gas velocity helps to ensure a more uniform layer thickness, it may also cause turbulence between the injector flows due to their varying velocities. Also, the risk of side effects such as uneven layer thickness, dissipation of reactant, or premature condensation of reactant may be increased.

DISCLOSURE OF THE INVENTION

One aspect of the invention provides a reactor. A reactor according to this aspect of the invention preferably includes a chamber and a substrate carrier mounted for movement within the chamber, most preferably for rotational movement about an axis. The substrate carrier is adapted to hold one or more substrates, most preferably so that surfaces of the substrates to be treated lie substantially perpendicular to the axis. The reactor according to this aspect of the invention desirably includes a gas stream generator arranged to deliver one or more gas streams within the chamber directed toward the substrate carrier at a substantially uniform velocity.

The gas stream generator most preferably is arranged so that the one or more gas streams include a carrier gas and a reactant gas, and so that different portions of the one or more gas streams contain different concentrations of the reactant gas. Where the substrate carrier is mounted for rotational movement about an axis, the gas stream generator desirably is arranged to supply said one or more gas streams with different concentrations of the reactant gas at different radial distances from the axis. The gas directed towards a portion of the substrate carrier near the axis desirably includes a relatively large concentration of the carrier gas and a relatively small concentration of the reactant gas, whereas the gas directed towards a portion of the substrate carrier desirably includes a high concentration of the reactant gas.

The gas stream generator may include a plurality of gas inlets communicating with the chamber at different distances from the axis, as well as one or more sources of a reactant gas connected to the inlets and one or more sources of a carrier gas connected to at least one of inlets.

A further aspect of the invention includes methods of treating substrates. A method according to this aspect of the invention desirably includes rotating a substrate support about an axis while supporting one or more substrates to be treated on the support so that surfaces of the substrates lie substantially perpendicular to said axis. The method further includes introducing a reactant gas and a carrier gas into the chamber so that said gases flow within said chamber toward the surfaces in one or more streams having substantially uniform velocity at different radial distances from said axis. The one or more gas streams are arranged so that different portions of the substrate surfaces at different radial distances from the axis receive substantially the same amount of said reactant gas per unit time per unit area. Most preferably, the step of introducing the carrier gas and reactant gas includes mixing at least some of the reactant gas with the carrier gas so that gas flowing toward radially outward portions of the substrate surfaces has a higher concentration of the reactant gas than gas flowing toward radially inward portions of the surfaces, close to the axis.

Preferred reactors and methods according to the foregoing aspects of the invention can provide uniform distribution of the reactant gas over the treatment surface of a substrate carrier, such as over the surface of a rotating disk substrate carrier, while avoiding turbulence caused by differing reactant gas velocities.

BRIEF DESCRIPTION OF THE DRAWINGS

FIG. 5A is a fragmentary sectional elevational view depicting a reactor according to yet another embodiment of the invention.

FIG. 5B is a sectional view along line 5B-5B in FIG. 5A.

MODES FOR CARRYING OUT THE INVENTION

Figure 1A:
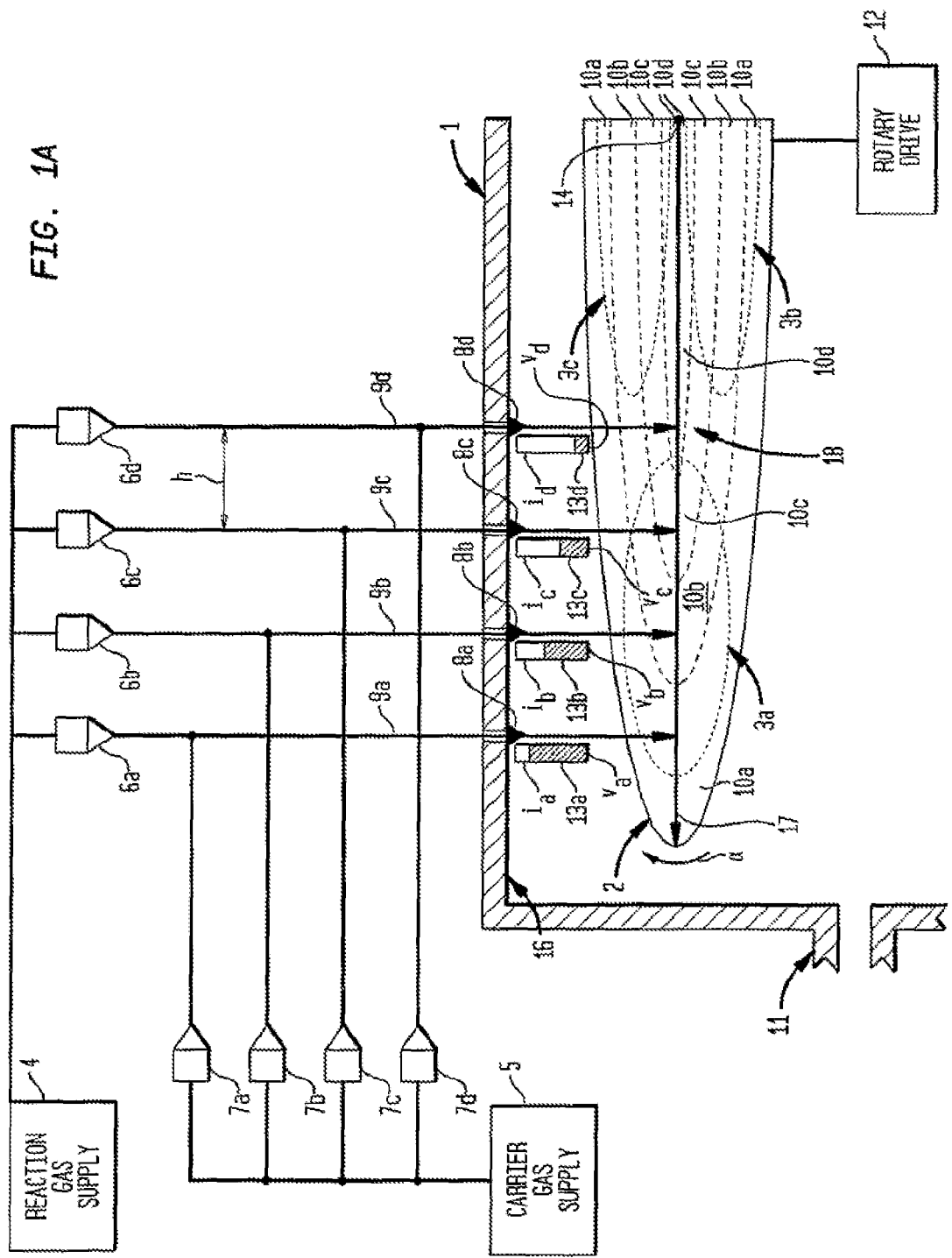
FIG. 1A is a schematic view depicting a reactor according to one embodiment of the present invention.
Figure 1B:
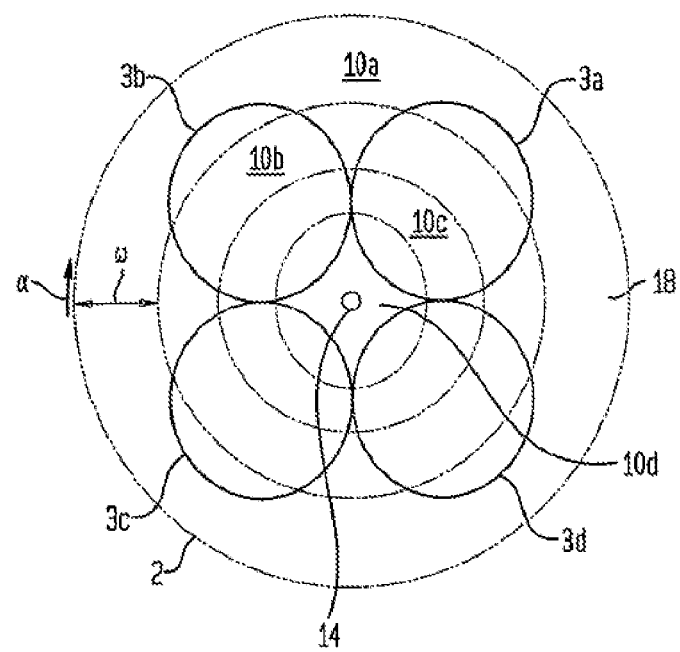
FIG. 1B is a top plan view of a substrate carrier used in the embodiment of FIG. 1A.

An apparatus according to one embodiment of the invention, depicted schematically in FIG. 1, includes a reaction chamber 1 and a substrate carrier 2. The chamber includes a top wall 16 and an exhaust port 11. The substrate carrier 2 is mounted within the chamber 1 for rotation about a central axis 14 and connected to a rotary drive system 12 so that the substrate carrier 2 can be rotated around the axis 14. The substrate carrier 2 defines a treatment surface 18 in the form of a generally planar disc perpendicular to axis 14 and facing toward top wall 16. Only a portion of such surface 18 is depicted in FIG. 1. The reaction chamber 1 is equipped with other conventional elements (not shown) for facilitating the desired epitaxial growth reaction as, for example, a heating system for maintaining the substrate carrier at an elevated temperature, temperature monitoring devices and pressure monitoring devices. These features of the apparatus may be of the type used in reactors sold under the trademark TURBODISC® by the Emcore Corporation of Somerset, N.J.

The reactor has a plurality of gas stream inlets 8a-8d communicating with the interior of the chamber through top wall 16. In the embodiment of FIG. 1, each inlet is in the form of a single port directed downwardly in a direction parallel to central axis 14 towards the treatment surface 18 of the carrier, and the port of each inlet is of the same size. Gas stream inlets 8a-8d are arranged along a common plane which extends radially from central axis 14. The common plane is a plane defined by axis 14 and a radial line 17 extending perpendicular to axis 14. The gas stream inlets 8a-8d are spaced apart from one another, for example, by a uniform spacing distance h in the radial direction. Each inlet 8 is aligned with a different annular zone of treatment surface 18. Thus, outermost or first inlet 8a is aligned with an outermost zone 10a furthest from axis 14; inlet 8b is aligned with the next zone 10b; inlet 8c is aligned with zone 10c, and inlet 8d is aligned with the innermost zone 10d, closest to axis 14. Although the zone borders are indicated by broken lines in FIG. 1 for clarity of illustration, these zones typically are not delineated by visible features of the substrate carrier.

The reactor includes a plurality of reaction gas sources 6a-6d, each such source being adapted to supply a reaction gas at a predetermined mass flow rate. Any device capable of providing the reaction gas at a predetermined rate may be used. In the arrangement illustrated, each reaction gas source 6a-6d is a flow restricting device, and all of the sources are connected to a common supply 4 of the reaction gas as, for example, a tank holding such gas under pressure. The flow restricting device incorporated in each gas sources 6a-6d may include any conventional flow control structure such as a fixed orifice, a manually adjustable valve or an automatically-controlled valve linked to a feedback control system (not shown) or a metering pump. Where the reactant gas is formed by vaporization from the liquid phase, each reactant gas source may include a separate evaporator arranged to control the rate of vaporization, or else each gas source may include a flow restricting device as discussed above, all of these being connected to a common evaporator.

The reactant gas may be any gas, vapor, or material desired to be injected into the reactor to participate in the deposition of a substrate within the reactor. More particularly, the reactant gas may be any gas which is suitable for treating the substrate surface. For example, where the desired treatment is growth of a semiconductor layer such as epitaxial growth, the reactant gas includes one or more constituents of the semiconductor to be grown. For example, the reactant gas may include one or more metal alkyls for deposition of a compound semiconductor. The reactant gas may be a mixture of plural chemical species, and may include inert, non-reactive components. Where the desired reaction includes etching of a substrate surface, the reactant gas may include a constituent reactive with the material of the substrate surface.

The types of material systems to which the present invention can be applied can include, for example, epitaxial growth of Group III-V semiconductors such as GaAs, GaP, $GaAs_{1-x}P_x$, $Ga_{1-y}Al_yAs$, $Ga_{1-y}In_yAs$, AlAs, InAs, InP, InGaP, InSb, GaN, InGaN, and the like. However, the invention can also be applied to other systems. These include Group II-VI compounds, such as ZnSe, CdTe, HgCdTe, CdZnTe, CdSeTe, and the like; Group IV—IV compounds, such as SiC, diamond, and SiGe; as well as oxides, such as YBCO, BaTiO, $MgO_2$, ZrO, $SiO_2$, ZnO and ZnSiO; and metals, such as Al, Cu and W. Furthermore, the resultant materials will have a wide range of electronic and opto-electronic applications, including high brightness light emitting diodes (LED's), lasers, solar cells, photocathodes, HEMT's and MESFET's.

Carrier gas sources 7a-7d are also provided. The carrier gas sources 7a-7d may be similar in structure to the reaction gas sources, and may be connected to a common supply 5 of a carrier gas. Each gas stream inlet 8a-8d is connected to one reaction gas source 6a-6d and to one carrier gas source 7a-7d. For example, inlet 8a is connected to reaction gas source 6a and carrier gas source 7a, whereas inlet 8d is connected to reaction gas source 6d and carrier gas source 7d.

The carrier gas may be any carrier desired which does not participate in the deposition reaction in the chamber given the reactant gasses to be applied to the substrate, such as an inert gas or a non-participating gas in the reaction, or, alternatively the carrier gas may be, for example, itself a reactant gas which serves as a non rate limiting participant in a reaction and thus may be provided in any desired quantity so long as such quantity is in excess of a rate limiting quantity in the reactor at the desired temperature, pressure and conditions of reaction.

In a method according to one embodiment of the invention, substrates 3 in the form of flat, thin discs are disposed on the treatment surface 18 of the substrate carrier 2 so that the substrates 3 overlay the treatment surface 18 and so that the surfaces of the substrates 3 to be treated face upwardly, toward top wall 16. Desirably, the exposed surfaces of the substrate 3 are coplanar or nearly coplanar with the surrounding portions of the treatment surface. For example, a substrate 3 in the form of a relatively thin wafer placed on a treatment surface 18 will have an exposed, upwardly facing surface elevated above the surrounding portions of the treatment surface 18 by only the thickness of the wafer 3. The treatment surface 18 of the substrate carrier 2 may include pockets or depressions having a depth approximately equal to the thickness of the wafer (not shown).

When the substrate carrier 2 and substrates 3 are at the desired temperature for the reaction, and the interior of the chamber 1 is at the desired subatmospheric pressure for the particular reaction to be accomplished, the reaction gas sources 6a-6d and carrier gas sources 7a-d are actuated to supply gasses to inlets 8a-8d. The reactant gas 4 and carrier gas 5 supplied to each inlet mix to form a combined gas stream 9a-9d issuing from each inlet 8a-8d. The gas streams 9a-9d issuing from the inlets flow downwardly into the chamber, in the axial direction parallel to axis 14, and impinge on the treatment surface and on the exposed surfaces of the substrates 3. The gas streams 9a-9d from different inlets 8a-8d impinge on different zones 10a-10d of the treatment surface 18. For example, stream 9a issuing from inlet 8a impinges predominantly on innermost zone 10a, whereas streams 9b, 9c and 9d impinge predominantly on zones 10b, 10c and 10d, respectively. Thus, although the streams 9a-9d merge with one another to form a substantially continuous, radially elongated stream or curtain of gas flowing towards the substrate carrier, the individual streams 9a-9d of from the various inlets 8a-8d pass to different zones 10a-10d of the treatment surface 18. Stated another way, the gas impinging on innermost zone 10d of the treatment surface 18 is composed principally of gas in stream 9d from inlet 8d, whereas the gas impinging on zone 10b is composed principally of gas in stream 9b from inlet 8b, and so on. As the substrate carrier 2 rotates at a predetermined rotation rate α, different portions of the carrier 2 at different circumferential positions around axis 14 are brought into alignment with the gas streams 9a-9d, so that exposure of the treatment surface 18 to the gas streams 9a-9d is the same at all circumferential positions.

To provide equal reaction rates on the various regions of the exposed substrate 3 surfaces, all regions 10a-10d of the treatment surface 18 should be provided with equal amounts of reactant gas 4 per unit area of treatment surface per unit time. However, the zones 10a-10d supplied by the various gas outlets are of unequal area. For example, zone 10a, adjacent the periphery of the treatment surface, has a larger surface area than zone 10d, adjacent the axis. Accordingly, the reactant gas flow rates provided by sources 6a-6d are selected to provide different flow rates of reactant gas in the streams 9a-9d issuing from the various inlets 8a-8d. Unless otherwise indicated, the flow rates referred to in this discussion are molar flow rates. The molar flow rate represents the number of molecules of gas (or atoms in a monatomic gas) per unit time. Source 6a is arranged to supply reactant gas at a relatively large flow rate to inlet 8a for stream 9a, whereas source 6d is set to supply reactant gas at a relatively small flow rate to inlet 8d for stream 9d. Sources 6b and 6c supply the reactant gas at intermediate flow rates. Stated another way, the reactant gas flow rate increases in direct relation to the distance between the central axis 14 of rotation for the substrate carrier 2 of the reactor 1 and the gas inlet 8a-8d to be supplied with reactant gas.

Carrier gas sources 7a-7d are set to supply the carrier gas 5 at different flow rates to the various inlets 8a-8d. The flow rates of the carrier gas are selected so that the velocities of the various streams 9a-9d will be equal to one another. For inlets of the same configuration—which provide streams of equal cross-sectional area—the volumetric flow rate of the streams 9a-9d issuing from each inlet 8a-8d should be equal.

As a first approximation, assuming that the gases are near ideal gases, the volumetric flow rate of the gas in each stream is directly proportional to the total molar flow rate in the stream, i.e., to the sum of the reactant gas molar flow rate and the carrier gas molar flow rate. Thus, to provide streams having equal total molar flow rates and hence equal velocity, the carrier gas molar flow rate supplied by source 7d to inlet 8d must be greater than the carrier gas molar flow rate supplied by source 7a to inlet 8a. The greater carrier gas flow rate supplied to inlet 8d and incorporated in stream 9d compensates for the smaller reactant gas flow rate from reactant gas source 6d relative to that provided by reactant gas source 6a to inlet 8a.

Stated another way, the various streams have the same total volumetric flow rate but different concentrations of reactant gas. Stream 9a impinging on the largest zone 10a has the highest reactant gas flow rate, and the lowest carrier gas flow rate, whereas stream 9d impinging on the smallest zone 10d has the lowest reactant gas concentration, and hence the highest carrier gas flow rate.

This arrangement is indicated graphically by bars 13a-13d in FIG. 1. The overall length C of bar 13d represents the total molar flow rate or volumetric flow rate of stream 9d issuing from inlet 8d. The length of the darkened portion of this bar represents the reactant gas molar flow rate $v_a$ in the stream, whereas the white portion of the bar represents the carrier gas molar flow rate $i_a$ in the same stream 9d. Bars 13a, 13b and 13c similarly represent the composition and flow rate of streams 9a, 9b and 9c respectively. The overall lengths C of all bars 13 are equal, but bars 13a, 13b and 13c represent the progressively greater reactant gas molar flow rates $v_c$, $v_b$ and $v_a$ and progressively lower carrier gas molar flow rates $i_c$, $i_b$, $i_a$ in streams 9c, 9b and 9a. By supplying the various streams 9a-9d at different concentrations of reactant gas but at the same total stream velocity, the system avoids turbulence and other flow irregularities which would be created by streams of different velocities, and yet supplies substantially equal molar flow rates of reactant gas per unit area to the various zones of the of the treatment surface.

Thus, the exposed surfaces of the wafer 3 at all portions of the treatment surface 18 receive substantially the same amount of reactant gas per unit time per unit area. The reaction thus proceeds at a substantially uniform rate over all of the exposed wafer surfaces 3. For example, where the reaction involves deposition of a layer such as epitaxial growth, the deposited layer grows at a substantially uniform rate on the various exposed surfaces.

The system can be varied to deliver unequal amounts of reactant gas per unit surface area per unit time. For example, the gas flow pattern within the reactor may include some flow in the radially outward direction, away from axis 14 at or near the treatment surface. Such flow may tend to carry some unreacted reactant gas from the innermost zone 10d toward the outermost zone 10a. To compensate for this effect, the gas sources can be adjusted to deliver slightly more reactant gas to the innermost zone, as by increasing the reactant gas concentration in innermost stream 9d above that which would be required to achieve exactly equal reactant gas flow per unit time. In this case, the reactant gas flow and reactant gas concentration will not be exactly proportional to radial distance from axis 14. However, the system still uses multiple gas streams of differing concentration but the same velocity to provide a downwardly or axially flowing gas curtain having substantially uniform velocity but unequal reactant gas concentration at different radial locations.

In another variant, the reactant gas concentration in the gas stream from the outermost inlet 8a may be 100%, so that the downwardly-flowing gas impinging on the outermost zone consists entirely of the reactant gas, with no carrier gas. In this instance, carrier gas source 7a associated with inlet 8a may be omitted. Also, the principles discussed above can be applied with more or fewer gas inlets directed onto more or fewer zones.

Figure 2:
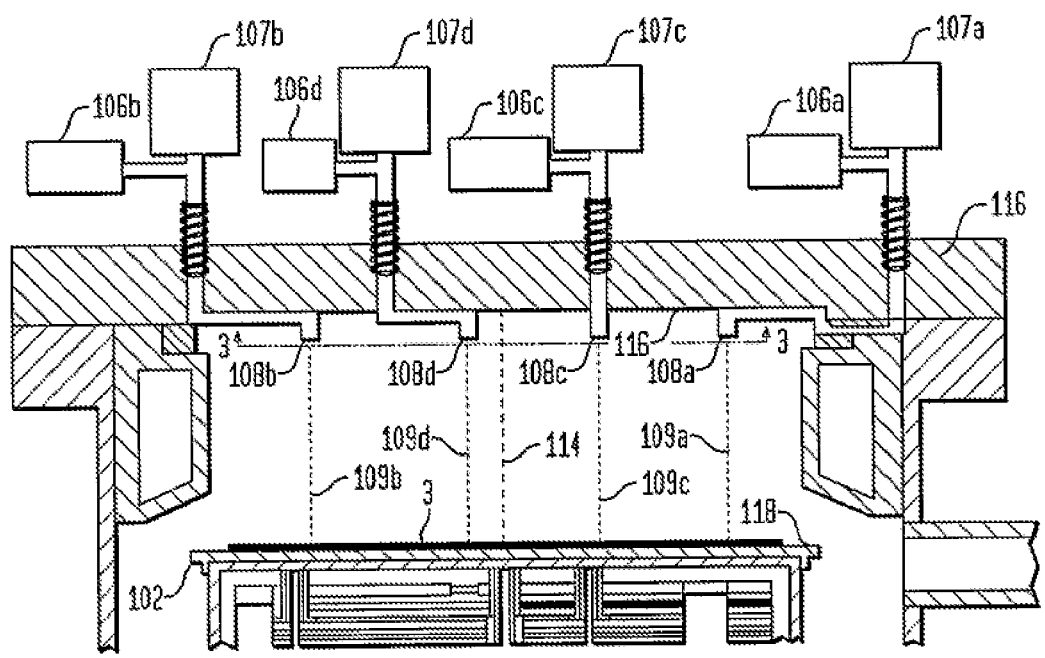
FIG. 2 is a fragmentary sectional elevational view depicting a reactor according to another embodiment of the invention.
Figure 3:
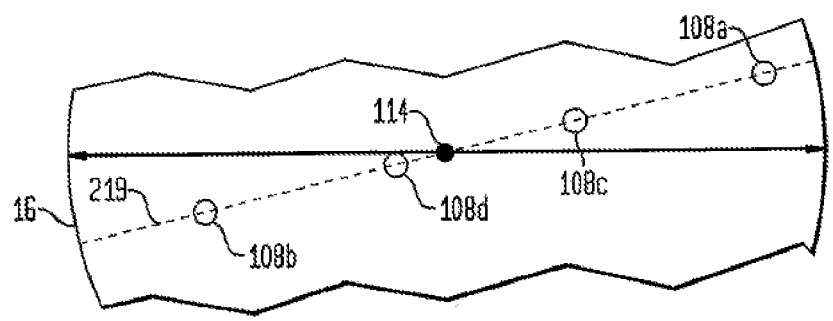
FIG. 3 is a fragmentary view along line 3-3 in FIG. 2.
Figure 4:
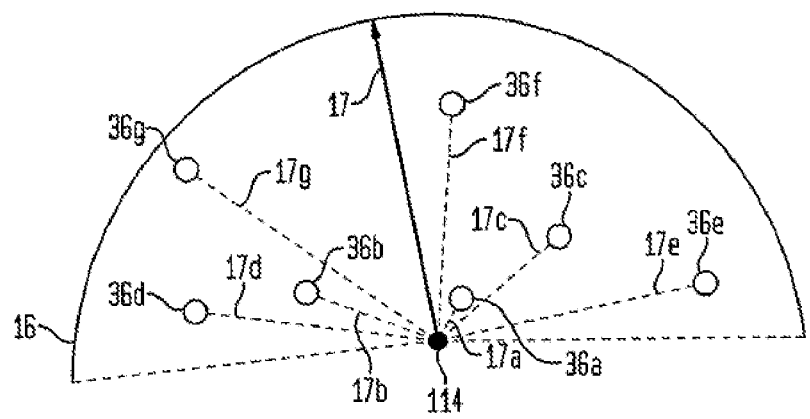
FIG. 4 is a fragmentary bottom plan view of a plate used in a reactor according to a further embodiment of the invention.

In apparatus according to a further embodiment of the invention, seen in FIGS. 2 and 3, the gas stream inlets are not disposed in a radial plane on one side of the axis of rotation as discussed above with reference to FIG. 1. Instead, in the embodiment of FIGS. 2 and 3, the outermost gas inlet 108*a* is disposed on one side of the axis of rotation 114 of substrate carrier 102, and at a large radial distance from the axis, whereas the next gas inlet 108*b* lies on the opposite side of axis 114 but at a lesser radial distance from the axis. Inlets 108*c* and 108*d*, at lesser radial distances from axis 114, also lie on opposite sides of the axis along a common diameter 219 (FIG. 3). Here again, the different gas streams 109*a*-109*d* impinge on different zones of treatment surface 118 having different areas. The carrier gas flows from carrier gas sources 107*a*-107*d* and the reactant gas flows from reactant gas sources 106*a*-106*d* are selected in the same manner as described above, so as to provide gas streams 109*a*-109*d* with different reactant gas concentrations and flow rates, but with the same velocity. In a further variant, the gas inlets may be provided as two complete sets, one on each side of the central axis, each such set including a full complement of gas inlets adapted to direct gas onto all of the zones of the treatment surface. More than two sets of gas inlets may be provided as, for example, four sets disposed on two diameters. In a further variant (FIG. 4) the various gas inlets 36*a*-36*g* may be distributed along different radii 17*a*-17*g*, and at different radial distances from the central axis 114.

In the apparatus discussed above, each gas stream is formed by mixing carrier gas and reactant gas prior to introducing the mixed gases into the reaction chamber. However, this is not essential. In the apparatus of FIGS. 5A and 5B, the innermost gas inlet 208*d* includes two separate ports opening through reactor top wall 216: a reactant gas port 230*d* and a carrier gas port 232*d*. The reactant gas port 230*d* is connected to a reactant gas source 206*d*, whereas the carrier gas port 232*d* is connected to a carrier gas source 207*d*. Ports 230*d* and 232*d* are disposed adjacent to one another, so that the carrier gas introduced through port 232*d* merges with the reactant gas introduced through port 230*d* just after the gases enter the interior of reaction chamber 201, and form a combined gas stream passing downwardly onto the associated zone of treatment surface 218. Each of the other inlets 208*a*-208*c* is constituted by a similar pair of ports, and operates in the same manner.

The apparatus of FIGS. 5A and 5B also includes a porous plate 215 mounted within reaction chamber 210, between top wall 216 and the treatment surface. As discussed in greater detail in U.S. Pat. No. 6,197,121, the disclosure of which is incorporated by reference here, such a porous plate can include, for example, a wire mesh screen supported by a set of coolant conduits. The porous plate has an upstream or inlet side facing toward the top wall 216, and has a downstream side facing toward substrate carrier 202 (toward the bottom of the drawing in FIG. 5A). The porous plate 215 is spaced from the top wall. A set of barrier walls 250 extend between the top wall 216 and the porous plate 215 in the vicinity of inlets 208*a*-208*d*. The barrier walls 250 subdivide the space upstream of the porous plate into spaces 254*a*-254*d*. Each gas inlet 208*a*-208*d* opens into one such space. Additional walls 256 separate spaces 254*a*-254*d* from other spaces 258 (FIG. 5B) disposed upstream of the porous plate.

In operation, the carrier gas and reactin gas provided through each inlet mix within the space 254 associated with that inlet, and pass through a region of the porous plate aligned with such space. For example, the combined gasses provided by inlet 208*d*, including reactant gas from port 230*d* and carrier gas from port 232*d*, passes downstream through a region of the porous plate 215, and passes from the downstream side of the injection plate to the treatment surface as a stream 209*d*, so that this stream impinges principally on the innermost region 210*d* of the treatment surface 218. In the same manner, the gases from inlets 208*c*, 208*b* and 208*d* mix in spaces 254*c*, 254*b* and 254*a*, respectively, to form streams 209*c*, 209*b* and 209*a*, which impinge on other regions of the treatment surface. Although the individual streams are depicted separately in FIG. 5A for clarity of illustration, in actuality the streams spread radially and merge with one another enroute from the porous plate 215 to the treatment surface. Here again, the flow rates of the carrier gas and reaction gas supplied by each of the gas sources are selected so that the total flow rate in each stream 209, and hence the velocity of each stream, is substantially equal, but the concentration of reactant gas in the various streams is unequal. In this arrangement as well, additional sets of inlets 208' for the carrier gas and reaction gas may be provided at other locations spaced circumferentially around central axis 214. Each such set is arranged in the same manner as inlets 208*a*-208*d*. Also, other gases used in the growth process can be introduced through additional inlets (not shown) connected to additional spaces 258. Such other gases can be introduced at the same time as the carrier gas and reactant gas, or at other times, during other stages of the process.

A similar porous plate may be used with inlets such as those discussed above with reference to FIGS. 1A and 2.

Figure 6:
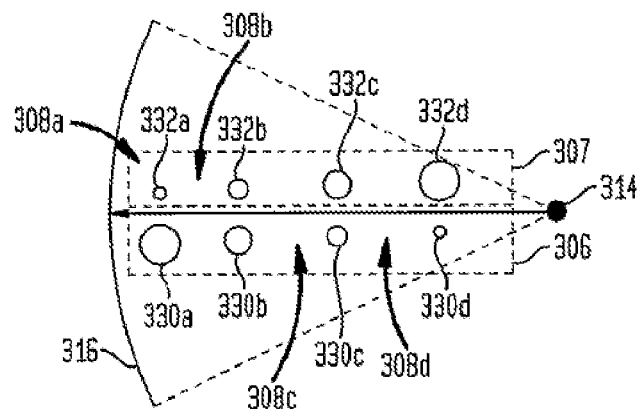
FIGS. 6, 7 and 8 are view similar to FIG. 4 but depicting portions of plates used in reactors according to additional embodiments of the invention.

In apparatus according to a further embodiment (FIG. 6), the ports constituting the inlets act to control the amounts of gases in each gas steam. In this embodiment, the outermost gas inlet 308*a* includes a reaction gas port 330*a* and a carrier gas port 332*a*, whereas each of the other gas inlets 308*b*, 308*c* and 308*d* includes a similar pair of ports. Here again, the ports constituting each gas inlet are disposed adjacent to one another. The ports are arranged along a common radial line 317. All of the reaction gas ports 330*a*, 330*b*, 330*c* and 330*d* are connected to a common conduit 306 which in turn is connected to a supply of reactant gas, so that all of the reactin gas ports are supplied with the reaction gas at substantially the same pressure. Likewise, all of the carrier gas ports 332*a*, 332*b*, 332*c* and 332*d* are connected to a common conduit 307, which in turn is connected to a supply of the carrier gas, so that all of the carrier gas ports are supplied with the carrier gas at substantially the same pressure. The sizes of the ports, and hence the flow resistances of the ports, differ. Reactant gas port 330*a* of the outermost gas inlet 308*a* is relatively large, and has relatively low flow resistance, whereas carrier gas port 332*a* of the outermost gas inlet is relatively small, and hence has high flow resistance. Accordingly, the gas stream issuing from these ports and hence from gas inlet 308*a* will incorporate a large proportion of reactant gas and a small proportion of carrier gas. Conversely, reactant gas port 330*d* of the innermost gas inlet 308*d* is relatively small, and has high flow resistance, whereas the carrier gas port 332*d* of the same inlet is relatively large, and has high flow resistance. The gas stream issuing from inlet 308*d* will have a relatively large proportion of carrier gas. As will be appreciated with reference to FIG. 6, the sizes of the reactant gas ports 330 increase progressively in the radially outward direction, away from axis 314, i.e., in the direction from the smallest zone of the treatment surface to the largest zone, so that the flow resistance of the reactant gas ports decreases progressively in this direction. Conversely, the flow resistance of the carrier gas ports increases progressively in the same direction. The apparatus thus will provide gas streams having substantially the same total flow rate (carrier gas plus reactant gas) but differing concentrations of reactant gas, impinging on the differing zones of the treatment surface. Plural sets of ports as described above can be provided along numerous radial lines, so as to provide a plurality of such streams around the circumference of the chamber.

Figure 7:
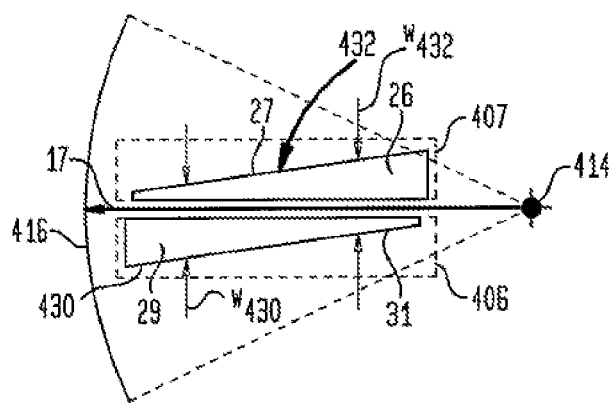

In a further variant (FIG. 7) the separate ports and inlets of are replaced by a carrier gas passage 432 and reactant gas passage 430 extending through top plate 416. The downstream ends of these passages (the ends of the passages opening into the reaction chamber) are visible in FIG. 7. The passages are disposed side-by-side. Carrier gas passage 432 is connected to carrier gas conduit 407, whereas reactant gas passage 430 is connected to a reactant gas conduit 406. Conduits 407 and 406 are connected to supplies of carrier gas and reactant gas, respectively. The carrier gas passage 432 has a width w432 which decreases progressively in the radially outward direction away from axis 414. Thus, the resistance of the carrier gas passage to flow of the carrier gas in the downstream direction of the passage (the direction out of the plane of the drawing in FIG. 7) increases progressively in the radially outward direction. The reactant gas passage has a width w430 which increases progressively in the radially outward direction, so that the resistance of the reactant gas passage to downstream flow of reactant gas decreases progressively in the radially outward direction. In operation, a relatively large amount of reactant gas passes through the radially outer portion of the reactant gas passage 430 whereas a relatively small amount of carrier gas passes through the radially outer portion of carrier gas passage 432. Conversely, a small amount of reactant gas and a large amount of carrier gas pass through the radially inner portions of the passages. The carrier and reactant gases merge to form a gas stream passing downstream (in the direction out of the plane of the drawing in FIG. 7), such gas stream having a substantially constant total flow rate per unit radial distance and substantially constant velocity at all radial locations but having progressively increasing reactant gas concentration in the radially outward direction.

Figure 8:
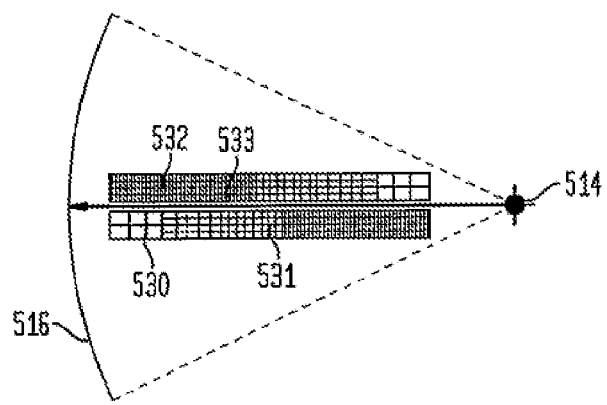

A reactor according to a further embodiment of the invention, shown in FIG. 8, has a reactant gas passage 530 and carrier gas passage 532 similar to the passages discussed above with reference to FIG. 7. In the reactor of FIG. 8, however, the passages have constant width over their radial extent. Reactant gas passage 530 is filled with a mesh or other porous structure 531 having progressively increasing porosity in the radially outward direction, away from axis 514. Accordingly, the resistance of passage 530 to downstream flow of reactant gas decreases in the radially outward direction. The carrier gas passage 532 is filled with a porous structure 533 having progressively decreasing porosity, and hence progressively increasing flow resistance, in the radially outward direction. The net effect is the same as discussed with reference to FIG. 7. Other features of the passageways can be varied to achieve similar variations in flow resistance along the radial extent of the passageways. For example, the passageways can include baffles or partial obstructions disposed at various radial locations. In yet another variant, each passage can have different lengths, in the downstream direction of the passage, at its inner and outer edges. For example, where a passage extends through a plate, the thickness of the plate can vary in the radial direction so as to vary the length of the passage, and hence the flow resistance of the passage, in the radial direction.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

INDUSTRIAL APPLICABILITY

The present invention is applicable to the electronics manufacturing industry and where it is desired to manufacture electronics components in large number through the epitaxial growth of materials thereon. The present invention is applicable to, for example, vertical disk reactors for the epitaxial growth of materials on silicon wafers for electronics components.

The invention claimed is:

1. A reactor for treating a substrate comprising:
a chamber having a top wall defining an upper boundary of said chamber;
a substrate carrier mounted for movement within said chamber, said substrate carrier being adapted to hold one or more substrates; and
a gas stream generator arranged to deliver a gas stream having substantially uniform velocity but different concentrations of a reactant gas at different locations within said gas stream, said gas stream generator being arranged to direct said gas stream within said chamber toward said substrate carrier;
wherein said substrate carrier is mounted for rotational movement about an axis and said gas stream generator is adapted to supply said gas stream with different concentrations of said reactant gas at different radial distances from said axis;
wherein said gas stream generator includes a plurality of gas stream inlets spaced apart from one another and different gas sources connected to said gas stream inlets, said gas sources being arranged so that gases supplied through different gas stream inlets have different concentrations of said reactant gas while maintaining substantially constant total gas velocity;
wherein at least one of said gas stream inlets includes a reactant gas port and an adjacent carrier gas port each opening into said chamber through said top wall, a carrier gas source of a carrier gas communicating with an interior of said chamber through said carrier gas port, and a reactant gas source of said reactant gas communicating with said interior of said chamber through said reactant gas port, such that, after being introduced into said chamber from the respective port, said reactant gas introduced through said reactant gas port and said carrier gas introduced through said carrier gas port mix within said chamber while flowing towards said substrate carrier; and
wherein said gas stream generator includes a structure defining a carrier gas passage and a reactant gas passage, a source of carrier gas communicating with an interior of said chamber through said carrier gas passage so that a carrier gas entering said chamber will pass in a downstream direction through said carrier gas passage, and a source of reactant gas communicating with said interior of said chamber through said reactant gas passage so that said reactant gas entering said chamber will pass in said downstream direction through said reactant gas passage, said carrier gas passage and said reactant gas passage each having a resistance to gas flow in said downstream direction, said resistance of said carrier gas passage increasing progressively in a radially outward direction away from said axis, and said resistance of said reactant gas passage decreasing progressively in said radially outward direction;

further including a choke structure comprising a plate, wherein said carrier gas passage is in the form of a carrier gas slot extending through said plate, and said reactant gas passage is in the form of a reactant gas slot extending through said plate, said carrier gas slot and said reactant gas slot each having a width transverse to said radially outward direction, said width of said carrier gas slot decreasing progressively in said radially outward direction, and said width of said reactant gas slot increasing progressively in said radially outward direction.

2. A reactor as claimed in claim 1, wherein said gas stream generator is adapted to supply said gas stream with concentrations of said reactant gas at a rate proportional to radial distance from said axis.

3. A reactor as claimed in claim 1, wherein said gas stream generator issues said gas stream downwardly into said chamber in a direction parallel to said axis.

4. A reactor as claimed in claim 1, wherein the chamber further comprises a porous plate adapted to permit the gas stream to pass therethrough, the porous plate being positioned within the chamber between the top wall of the chamber and the substrate carrier.

5. A reactor for treating a substrate comprising:
a chamber;
a substrate carrier mounted for movement within said chamber, said substrate carrier being adapted to hold one or more substrates; and
a gas stream generator arranged to deliver a gas stream having substantially uniform velocity but different concentrations of a reactant gas at different locations within said gas stream, said gas stream generator being arranged to direct said gas stream within said chamber toward said substrate carrier;
wherein said substrate carrier is mounted for rotational movement about an axis and said gas stream generator is adapted to supply said gas stream with different concentrations of said reactant gas at different radial distances from said axis;
wherein said gas stream generator includes a structure defining a carrier gas passage and a reactant gas passage, a source of carrier gas communicating with an interior of said chamber through said carrier gas passage so that a carrier gas entering said chamber will pass in a downstream direction through said carrier gas passage, and a source of reactant gas communicating with said interior of said chamber through said reactant gas passage so that said reactant gas entering said chamber will pass in said downstream direction through said reactant gas passage, said carrier gas passage and said reactant gas passage each having a resistance to gas flow in said downstream direction, said resistance of said carrier gas passage increasing progressively in a radially outward direction away from said axis, and said resistance of said reactant gas passage decreasing progressively in said radially outward direction;
the reactor further including a choke structure comprising a plate, wherein said carrier gas passage is in the form of a carrier gas slot extending through said plate, and said reactant gas passage is in the form of a reactant gas slot extending through said plate, said carrier gas slot and said reactant gas slot each having a width transverse to said radially outward direction, said width of said carrier gas slot decreasing progressively in said radially outward direction, and said width of said reactant gas slot increasing progressively in said radially outward direction.

6. A reactor as claimed in claim 5, wherein said gas stream generator is adapted to supply said gas stream with concentrations of said reactant gas at a rate proportional to radial distance from said axis.

7. A reactor as claimed in claim 5, wherein said gas stream generator issues said gas stream downwardly into said chamber in a direction parallel to said axis.

* * * * *